United States Patent
Guo et al.

(10) Patent No.: US 9,275,899 B2
(45) Date of Patent: Mar. 1, 2016

(54) CHEMICAL MECHANICAL POLISHING COMPOSITION AND METHOD FOR POLISHING TUNGSTEN

(71) Applicant: Rohm and Haas Electronic Materials CMP Holdings, Inc., Newark, DE (US)

(72) Inventors: Yi Guo, Newark, DE (US); Raymond L. Lavoie, Jr., Hockessin, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 14/317,334

(22) Filed: Jun. 27, 2014

(65) Prior Publication Data

US 2015/0380295 A1  Dec. 31, 2015

(51) Int. Cl.
*H01L 21/768* (2006.01)
*C09G 1/02* (2006.01)

(52) U.S. Cl.
CPC .............. *H01L 21/7684* (2013.01); *C09G 1/02* (2013.01); *H01L 21/76877* (2013.01)

(58) Field of Classification Search
None
See application file for complete search history.

(56) References Cited

U.S. PATENT DOCUMENTS

| | | |
|---|---|---|
| 6,136,711 A | 10/2000 | Grumbine et al. |
| 6,506,682 B1 * | 1/2003 | Lee et al. ............. 438/693 |
| 7,253,111 B2 | 8/2007 | Liu et al. |
| 7,446,046 B2 | 11/2008 | Zhang et al. |
| 8,431,490 B2 | 4/2013 | Guo et al. |
| 2005/0076580 A1 | 4/2005 | Tamboli et al. |
| 2008/0020680 A1 | 1/2008 | Vacassy et al. |
| 2010/0167547 A1 * | 7/2010 | Kamimura ............. 438/693 |
| 2013/0309946 A1 * | 11/2013 | Hamaguchi ............. 451/59 |

* cited by examiner

*Primary Examiner* — Allan Olsen
(74) *Attorney, Agent, or Firm* — Thomas S. Deibert

(57) ABSTRACT

A composition and method for tungsten is provided comprising: a metal oxide abrasive; an oxidizer; a tungsten removal rate enhancing substance according to formula I; and, water; wherein the polishing composition exhibits an enhanced tungsten removal rate and a tungsten removal rate enhancement.

15 Claims, No Drawings

CHEMICAL MECHANICAL POLISHING COMPOSITION AND METHOD FOR POLISHING TUNGSTEN

The present invention relates to the field of chemical mechanical polishing. In particular, the present invention is directed to a chemical mechanical polishing composition containing: a metal oxide abrasive; an oxidizer; a tungsten removal rate enhancing substance according to formula I; and, water; wherein the polishing composition exhibits an enhanced tungsten removal rate and a tungsten removal rate enhancement. The present invention also relates to a method of polishing a tungsten substrate.

Tungsten is widely used in semiconductor manufacturing for the formation of contact vias and holes connecting inter layer metal lines in integrated circuit fabrications. Typically, via holes are etched through an interlevel dielectric (ILD) to interconnection lines or to a semiconductor substrate. A thin adhesion layer of, for example, titanium nitride or titanium may then be formed over the ILD and into the etched via hole. A tungsten film is then blanket deposited over the adhesion layer and into the via. Excess tungsten is then removed by chemical mechanical polishing to form the tungsten vias.

The chemical mechanical polishing composition used in the tungsten polishing is an important variable in determining the success of the process. Depending on the choice of the abrasive and other additives, the chemical mechanical polishing composition can be tailored to provide effective polishing of various layers present at desired polishing rates while minimizing surface imperfections, defects, corrosion, and erosion of the interlevel dielectric adjacent to the tungsten vias. Furthermore, the chemical mechanical polishing composition may be used to provide controlled polishing selectivity to other materials present at the surface of the substrate being polished such as, for example, silicon oxide, titanium, titanium nitride, silicon nitride and the like.

Typically, tungsten polishing is accomplished using a chemical mechanical polishing composition that includes abrasive particles and a chemical reagent. Conventional polishing compositions for tungsten polishing use alumina ($Al_2O_3$) or silica ($SiO_2$) fine particles as an abrasive material in a harsh oxidizing environment. The choice of the oxidizing agent depends on the overall formulation of the polishing composition and the specific requirements of the tungsten integration in the substrate. The polishing compositions used are increasingly being formulated with ingredients that are designed to etch tungsten in an effort to enhance the tungsten removal rate exhibited by the composition. In many cases, however, the resulting compositions etch tungsten in a manner that chemically etches tungsten from the surface instead of converting the tungsten to a soft oxidized film that is more easily removed from the surface by mechanical abrasion. Due to this enhanced chemical action, such compositions tend to cause recessing of the tungsten plug. Recessed tungsten vias, where the surface of the tungsten in the via is below that of the surrounding interlayer dielectric material can cause electrical contact problems to other areas of the device. Moreover, the recessing in the center of the tungsten vias can lead to increased nonplanarity of the device on subsequent levels of the device. Etching of the tungsten from the center of the vias can also cause undesirable "keyholing".

One asserted solution for improving the tungsten via formation is disclosed by Grumbine, et al. in U.S. Pat. No. 6,136,711. Grumbine, et al. disclose a chemical mechanical polishing composition comprising: a compound that is capable of etching tungsten; and at least one inhibitor of tungsten etching, wherein the inhibitor of tungsten etching is a compound that includes a nitrogen containing functional group selected from compounds having three or more carbon atoms that form alkylammonium ions, amino alkyls having three or more carbon atoms, amino acids other than sulfur containing amino acids and mixtures thereof.

Notwithstanding, there is a continuing need for new chemical mechanical polishing compositions exhibiting enhanced tungsten polishing rates and selectivity.

The present invention provides a chemical mechanical polishing composition for polishing a substrate comprising tungsten, comprising: a metal oxide abrasive; an oxidizer; a tungsten removal rate enhancing substance according to formula I; wherein $R^1$, $R^2$ and $R^3$ are each independently selected from a $C_{1-4}$ alky group; and, water; wherein the chemical mechanical polishing composition has a pH of 1 to 5; wherein the chemical mechanical polishing composition exhibits a tungsten removal rate, $W^{RR}$, of $\geq 2,000$ Å/min; and, wherein the tungsten removal rate enhancing substance according to formula I imparts the chemical mechanical polishing composition with an enhanced tungsten removal rate, wherein the following expression is satisfied $$W^{RR} > W^{RR}_0$$

wherein $W^{RR}$ is the tungsten removal rate in Å/min for the chemical mechanical polishing composition and $W^{RR}_0$ is a tungsten removal rate in Å/min obtained under identical conditions except that the tungsten removal rate enhancing substance according to formula I is absent from the chemical mechanical polishing composition; and, wherein the chemical mechanical polishing composition exhibits a tungsten removal rate enhancement, $\Delta W^{RR}$, of $\geq 10\%$ according to the following equation $$\Delta W^{RR} = ((W^{RR} - W^{RR}_0)/W^{RR}_0) * 100\%.$$

The present invention provides a chemical mechanical polishing composition for polishing a substrate comprising tungsten and silicon oxide (e.g. TEOS), consisting of: 0.1 to 5 wt % of a silica abrasive; 0.1 to 0.5 wt % of a $KIO_3$ oxidizer; 0.01 to <1 wt % of a tungsten removal rate enhancing substance according to formula I; wherein $R^1$, $R^2$ and $R^3$ are each independently selected from a $C_{1-4}$ alky group; and, optionally, a pH adjusting agent; wherein the chemical mechanical polishing composition has a pH of 1 to 5; wherein the chemical mechanical polishing composition exhibits a tungsten removal rate, $W^{RR}$, of $\geq 2,000$ Å/min; and, wherein the tungsten removal rate enhancing substance according to formula I imparts the chemical mechanical polishing composition with an enhanced tungsten removal rate, wherein the following expression is satisfied $$W^{RR} > W^{RR}_0$$

wherein $W^{RR}$ is the tungsten removal rate in Å/min for the chemical mechanical polishing composition and $W^{RR}_0$ is a tungsten removal rate in Å/min obtained under identical conditions except that the tungsten removal rate enhancing substance according to formula I is absent from the chemical mechanical polishing composition; and, wherein the chemical mechanical polishing composition exhibits a tungsten removal rate enhancement, $\Delta W^{RR}$, of $\geq 10\%$ according to the following equation $$\Delta W^{RR} = ((W^{RR} - W^{RR}_0)/W^{RR}_0) * 100\%.$$

The present invention provides a method of chemical mechanical polishing a substrate, comprising: providing a polishing machine; providing a substrate, wherein the substrate comprises tungsten; providing a chemical mechanical polishing composition of the present invention; providing a chemical mechanical polishing pad; installing the chemical mechanical polishing pad and the substrate in the polishing machine; creating dynamic contact between the chemical mechanical polishing pad and the substrate; dispensing the chemical mechanical polishing composition in proximity to an interface between the chemical mechanical polishing pad and the substrate; wherein the chemical mechanical polishing composition comes into contact with tungsten of the substrate; and, wherein some tungsten is removed from the substrate.

DETAILED DESCRIPTION

The chemical mechanical polishing composition of the present invention is designed for polishing a substrate comprising tungsten. The chemical mechanical polishing composition of the present invention is particularly designed for the bulk removal of tungsten from the substrate. In certain integration schemes, tungsten is applied over the surface of a substrate to fill contact holes. In such schemes, the tungsten may be applied over an oxide layer. In these schemes, the excess tungsten is polished way from the surface of the substrate leaving the plugs behind in the contact holes.

The term "enhanced tungsten removal rate" used herein and in the appended claims to describe the removal rate of tungsten (for removal rate measured in Å/min) resulting from the addition of a tungsten removal rate enhancing substance according to formula I to the chemical mechanical polishing composition means that the following expression is satisfied:

$$W^{RR} > W^{RR}_0$$

wherein $W^{RR}$ is the tungsten removal rate in Å/min for a chemical mechanical polishing composition of the present invention containing a tungsten removal rate enhancing substance according to formula I, as measured under the polishing conditions set forth in the Examples; $W^{RR}_0$ is the tungsten removal rate in Å/min obtained under identical conditions except that the tungsten removal rate enhancing substance according to formula I is absent from the chemical mechanical polishing composition.

The term "tungsten removal rate enhancement" or "$\Delta W^{RR}$" used herein and in the appended claims means the relative enhancement in the tungsten removal rate according to the following equation $$\Delta W^{RR} = ((W^{RR} - W^{RR}_0) / W^{RR}_0) * 100\%$$

wherein $\Delta W^{RR}$ is the tungsten removal rate enhancement exhibited by a chemical mechanical polishing composition of the present invention containing a tungsten removal rate enhancing substance according to formula I; $W^{RR}$ is the tungsten removal rate in Å/min for a chemical mechanical polishing composition of the present invention containing a tungsten removal rate enhancing substance according to formula I, as measured under the polishing conditions set forth in the Examples; and, $W^{RR}_0$ is the tungsten removal rate in Å/min obtained under identical conditions except that the tungsten removal rate enhancing substance according to formula I is absent from the chemical mechanical polishing composition.

The chemical mechanical polishing composition of the present invention contains: a metal oxide abrasive; an oxidizer; a tungsten rate enhancing substance according to formula I

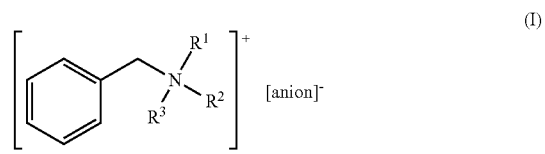

wherein $R^1$, $R^2$ and $R^3$ are each independently selected from a $C_{1-4}$ alky group; and, water; wherein the tungsten removal rate enhancing substance according to formula I imparts the chemical mechanical polishing composition with an enhanced tungsten removal rate, wherein the chemical mechanical polishing composition exhibits a tungsten removal rate enhancement.

Preferably, the chemical mechanical polishing composition of the present invention for polishing a substrate comprising tungsten, comprises: 0.01 to 40 wt % (preferably, 0.1 to 10 wt %; more preferably, 0.1 to 5 wt %; most preferably 1 to 4 wt %) of a metal oxide abrasive.

Preferably, the metal oxide abrasive is a silica abrasive. More preferably, the metal oxide abrasive is a silica abrasive, wherein the silica abrasive is selected from at least one of a colloidal silica abrasive and a fumed silica abrasive. Most preferably, the metal oxide abrasive is a silica abrasive selected from at least one of a positively charged colloidal silica abrasive (e.g., Fuso PL-3 colloidal silica abrasive available from Fuso Chemical Co., Ltd.) and a fumed silica abrasive (e.g., AERODISP® W 7512 S dispersion of hydrophilic fumed silica available from Evonik Industries).

Preferably, the metal oxide abrasive has a particle size of 1 to 300 nm (more preferably, 10 to 300; most preferably, 10 to 200 nm). More preferably, the metal oxide abrasive is a silica abrasive selected from at least one of a positively charged colloidal silica abrasive having an average particle size of 10 to 200 nm (most preferably, 25 to 50 nm) and a fumed silica abrasive having an average particle size of 10 to 300 nm (most preferably, 100 to 200 nm).

Preferably, the chemical mechanical polishing composition of the present invention contains 0.001 to 10 wt % (more preferably, 0.01 to 1 wt %; most preferably, 0.1 to 0.5 wt %) of an oxidizer.

Preferably, the oxidizer is selected from hydrogen peroxide ($H_2O_2$), monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, copper salts, chromium salts, cobalt salts, halogens, hypochlorites and a mixture thereof. More preferably, the oxidizer is selected from $KIO_3$ and $KIO_4^-$. Most preferably, the oxidizer is $KIO_3$.

Preferably, the chemical mechanical polishing composition of the present invention contains 0.001 to 10 wt % (more preferably, 0.01 to <1 wt %; most preferably, 0.1 to 0.8 wt %) of a tungsten removal rate enhancing substance according to formula I; wherein $R^1$, $R^2$ and $R^3$ are each independently selected from a $C_{1-4}$ alky group (preferably, wherein $R^1$, $R^2$ and $R^3$ are each independently selected from $C_{1-2}$ alkyl group; most preferably, wherein $R^1$, $R^2$ and $R^3$ are each independently a methyl group). Most preferably, the substance according to formula I is benzyltrimethylammonium hydroxide.

Preferably, the water contained in the chemical mechanical polishing composition of the present invention is at least one of deionized and distilled to limit incidental impurities.

Preferably, the chemical mechanical polishing composition of the present invention is designed for polishing at a pH of 1 to 5. More preferably, the chemical mechanical polishing composition of the present invention is designed for polishing at a pH of 2 to 4 (still more preferably, 2 to 3; most preferably, 2 to 2.5). The chemical mechanical polishing composition of the present invention can optionally include inorganic and organic pH adjusting agents. Preferably, the optional pH adjusting agent is selected from an inorganic acid and an inorganic base. Most preferably, the optional pH adjusting agent is selected from nitric acid, sulfuric acid, hydrochloric acid, phosphoric acid, potassium sulfate and potassium hydroxide.

Preferably, the chemical mechanical polishing composition of the present invention for polishing a substrate comprising tungsten, contains <0.001 wt % of inhibitor to control nonferrous interconnect removal rate by static etch or other removal mechanism. More preferably, the chemical mechanical polishing composition of the present invention for polishing a substrate comprising tungsten, contains <0.0001 wt % of inhibitor to control nonferrous interconnect removal rate by static etch or other removal mechanism. Most preferably, the chemical mechanical polishing composition of the present invention for polishing a substrate comprising tungsten, contains < the detectable limit of inhibitor to control nonferrous interconnect removal rate by static etch or other removal mechanism. Inhibitors to control nonferrous interconnect removal rate by static etch include azole inhibitors which are for copper and silver interconnects. Typical azole inhibitors include benzotriazole (BTA), mercaptobenzothioazole (MBT), tolytriazole and imidazole.

Preferably, the chemical mechanical polishing composition of the present invention exhibits a tungsten removal rate, $W^{RR}$, of ≥2,000 Å/min (preferably, ≥2,500 Å/min; more preferably, ≥2,600 Å/min; most preferably, ≥2,700 Å/min) measured with a platen speed of 113 revolutions per minute, a carrier speed of 111 revolutions per minute, a chemical mechanical polishing composition flow rate of 150 ml/min, and, a nominal down force of 29 kPa on a 200 mm polishing machine using a chemical mechanical polishing pad comprising a polyurethane polishing layer containing polymeric hollow core microparticles and a polyurethane impregnated non-woven subpad; wherein the tungsten removal rate enhancing substance according to formula I imparts the chemical mechanical polishing composition with an enhanced tungsten removal rate, wherein the following expression is satisfied $$W^{RR} > W^{RR}_0$$

wherein $W^{RR}$ is the tungsten removal rate in Å/min for the chemical mechanical polishing composition of the present invention and $W^{RR}_0$ is a tungsten removal rate in Å/min obtained under identical conditions except that the tungsten removal rate enhancing substance according to formula I is absent from the chemical mechanical polishing composition; and, wherein the chemical mechanical polishing composition of the present invention exhibits a tungsten removal rate enhancement, $\Delta W^{RR}$, of ≥10% (preferably, ≥15%; more preferably, ≥20%; most preferably, ≥25%) according to the following equation $$\Delta W^{RR} = ((W^{RR} - W^{RR}_0)/W^{RR}_0) * 100\%.$$

Most preferably, the chemical mechanical polishing composition of the present invention exhibits a tungsten removal rate enhancement, $\Delta W^{RR}$, wherein at least one of the following equations is satisfied:

$$((W^{RR} - W^{RR}_0)/W^{RR}_0) * 100 \geq 10;$$

$$((W^{RR} - W^{RR}_0)/W^{RR}_0) * 100 \geq 15;$$

$$((W^{RR} - W^{RR}_0)/W^{RR}_0) * 100 \geq 20; \text{ and,}$$

$$((W^{RR} - W^{RR}_0)/W^{RR}_0) * 100 \geq 25.$$

Preferably, the chemical mechanical polishing composition of the present invention for polishing a substrate comprising tungsten (preferably, tungsten and silicon oxide), consists of: 0.1 to 5 wt % of a silica abrasive; 0.1 to 0.5 wt % of a $KIO_3$ oxidizer; 0.01 to <1 wt % (preferably, 0.01 to 0.8 wt %) of a tungsten removal rate enhancing substance according to formula I, wherein $R^1$, $R^2$ and $R^3$ are each independently selected from a $C_{1-4}$ alky group (preferably, wherein $R^1$, $R^2$ and $R^3$ are each independently selected from $C_{1-2}$ alkyl group; most preferably, wherein $R^1$, $R^2$ and $R^3$ are each independently a methyl group); water; and, optionally, a pH adjusting agent; wherein the chemical mechanical polishing composition has a pH of 1 to 5 (preferably, 2 to 4; more preferably, 2 to 3; most preferably, 2 to 2.5); wherein the chemical mechanical polishing composition exhibits a tungsten removal rate, $W^{RR}$, of ≥2,000 Å/min (preferably, ≥2,500 Å/min; more preferably, ≥2,600 Å/min; most preferably, ≥2,800 Å/min) measured with a platen speed of 113 revolutions per minute, a carrier speed of 111 revolutions per minute, a chemical mechanical polishing composition flow rate of 150 ml/min, and, a nominal down force of 29 kPa on a 200 mm polishing machine using a chemical mechanical polishing pad comprising a polyurethane polishing layer containing polymeric hollow core microparticles and a polyurethane impregnated non-woven subpad; wherein the tungsten removal rate enhancing substance according to formula I imparts the chemical mechanical polishing composition with an enhanced tungsten removal rate, wherein the following expression is satisfied $$W^{RR} > W^{RR}_0$$

wherein $W^{RR}$ is the tungsten removal rate in Å/min for the chemical mechanical polishing composition of the present invention and $W^{RR}_0$ is a tungsten removal rate in Å/min measured under identical conditions except that the tungsten removal rate enhancing substance according to formula I is absent from the chemical mechanical polishing composition; and, wherein the chemical mechanical polishing composition of the present invention exhibits a tungsten removal rate enhancement, $\Delta W^{RR}$, of ≥10% (preferably, ≥15%; more preferably, ≥20%; most preferably, ≥25%) according to the following equation $$\Delta W^{RR} = ((W^{RR} - W^{RR}_0)/W^{RR}_0) * 100\%.$$

The chemical mechanical polishing method of the present invention preferably comprises: providing a polishing machine; providing a substrate, wherein the substrate comprises tungsten; providing a chemical mechanical polishing composition of the present invention; providing a chemical mechanical polishing pad; installing the chemical mechanical polishing pad and the substrate in the polishing machine; creating dynamic contact between the chemical mechanical polishing pad and the substrate; dispensing the chemical mechanical polishing composition in proximity to an interface between the chemical mechanical polishing pad and the substrate; wherein the chemical mechanical polishing composition comes into contact with tungsten of the substrate; and, wherein some tungsten is removed from the substrate.

The substrate provided in the chemical mechanical polishing method of the present invention comprises tungsten. Preferably, the substrate provided comprises tungsten applied over a surface of the substrate to fill contact holes, wherein the method of the present invention is used for bulk removal of tungsten from the substrate leaving tungsten plugs in the contact holes on the substrate. More preferably, the substrate provided comprises tungsten applied over an oxide on the surface of the substrate to fill contact holes. The oxide is preferably silicon oxide (e.g., borophosphosilicate glass (BPSG), plasma-etched tetraethyl ortho silicate (PETEOS), thermal oxide, undoped silicate glass, high density plasma (HDP) oxide).

The chemical mechanical polishing pad provided in the chemical mechanical polishing method of the present invention can by any suitable polishing pad known in the art. The chemical mechanical polishing pad provided is preferably selected from woven and non-woven polishing pads. Preferably, the chemical mechanical polishing pad provided comprises a polyurethane polishing layer. The chemical mechanical polishing pad provided can be made of any suitable polymer of varying density, hardness, thickness, compressibility and modulus. Preferably, the chemical mechanical polishing pad provided has at least one of a grooved and perforated polishing surface.

Preferably, in the chemical mechanical polishing method of the present invention, the chemical mechanical polishing composition is dispensed onto a polishing surface of the chemical mechanical polishing pad at or near an interface between the chemical mechanical polishing pad and the substrate.

Preferably, in the chemical mechanical polishing method of the present invention, dynamic contact is created at the interface between the chemical mechanical polishing pad and the substrate with a down force of 0.69 to 34.5 kPa.

Preferably, in the chemical mechanical polishing method of the present invention, the chemical mechanical polishing composition provided exhibits a tungsten removal rate, $W^{RR}$, of ≥2,000 Å/min. More preferably, in the chemical mechanical polishing method of the present invention, the chemical mechanical polishing composition provided exhibits a tungsten removal rate, $W^{RR}$, of ≥2,000 Å/min (preferably, ≥2,500 Å/min; more preferably, ≥2,600 Å/min; most preferably, ≥2,700 Å/min) measured with a platen speed of 113 revolutions per minute, a carrier speed of 111 revolutions per minute, a chemical mechanical polishing composition flow rate of 150 ml/min, and, a nominal down force of 29 kPa on a 200 mm polishing machine using a chemical mechanical polishing pad comprising a polyurethane polishing layer containing polymeric hollow core microparticles and a polyurethane impregnated non-woven subpad, wherein the tungsten removal rate is an enhanced tungsten removal rate, wherein the following expression is satisfied $$W^{RR} > W^{RR}{}_0$$

wherein $W^{RR}$ is the tungsten removal rate in Å/min for the chemical mechanical polishing composition of the present invention and $W^{RR}{}_0$ is a tungsten removal rate in Å/min measured under identical conditions except that the tungsten removal rate enhancing substance according to formula I is absent from the chemical mechanical polishing composition.

Preferably, in the chemical mechanical polishing method of the present invention, the chemical mechanical polishing composition provided exhibits a tungsten removal rate, $W^{RR}$, of ≥2,000 Å/min; and, a tungsten removal rate enhancement, $\Delta W^{RR}$, of ≥10% (preferably, wherein at least one of the following equations is satisfied for the chemical mechanical polishing composition provided:

$$((W^{RR}-W^{RR}{}_0)/W^{RR}{}_0)*100 \geq 10;$$

$$((W^{RR}-W^{RR}{}_0)/W^{RR}{}_0)*100 \geq 15;$$

$$((W^{RR}-W^{RR}{}_0)/W^{RR}{}_0)*100 \geq 20; \text{ and,}$$

$$((W^{RR}-W^{RR}{}_0)/W^{RR}{}_0)*100 \geq 25.$$

More preferably, in the chemical mechanical polishing method of the present invention, the chemical mechanical polishing composition provided exhibits a tungsten removal rate, $W^{RR}$, of ≥2,000 Å/min (preferably, ≥2,500 Å/min; more preferably, ≥2,600 Å/min; most preferably, ≥2,700 Å/min) measured with a platen speed of 113 revolutions per minute, a carrier speed of 111 revolutions per minute, a chemical mechanical polishing composition flow rate of 150 ml/min, and, a nominal down force of 29 kPa on a 200 mm polishing machine using a chemical mechanical polishing pad comprising a polyurethane polishing layer containing polymeric hollow core microparticles and a polyurethane impregnated non-woven subpad; wherein the tungsten removal rate is an enhanced tungsten removal rate, wherein the following expression is satisfied $$W^{RR} > W^{RR}{}_0$$

wherein $W^{RR}$ is the tungsten removal rate in Å/min for the chemical mechanical polishing composition of the present invention and $W^{RR}{}_0$ is a tungsten removal rate in Å/min measured under identical conditions except that the tungsten removal rate enhancing substance according to formula I is absent from the chemical mechanical polishing composition; and, a tungsten removal rate enhancement, $\Delta W^{RR}$, of ≥10% (most preferably, wherein at least one of the following equations is satisfied for the chemical mechanical polishing composition provided:

$$((W^{RR}-W^{RR}{}_0)/W^{RR}{}_0)*100 \geq 10;$$

$$((W^{RR}-W^{RR}{}_0)/W^{RR}{}_0)*100 \geq 15;$$

$$((W^{RR}-W^{RR}{}_0)/W^{RR}{}_0)*100 \geq 20; \text{ and,}$$

$$((W^{RR}-W^{RR}{}_0)/W^{RR}{}_0)*100 \geq 25.$$

Preferably, in the chemical mechanical polishing method of the present invention, the substrate provided further comprises silicon oxide. Preferably, in the chemical mechanical polishing method of the present invention, wherein the substrate provided further comprises silicon oxide, the chemical mechanical polishing composition provided exhibits a tungsten to silicon oxide removal rate selectivity of ≥5:1 (preferably, ≥6:1; more preferably, ≥50:1; most preferably, ≥75:1). More preferably, in the chemical mechanical polishing method of the present invention, wherein the substrate provided further comprises silicon oxide, the chemical mechanical polishing composition provided exhibits a tungsten removal rate, $W^{RR}$, of ≥2,000 Å/min (preferably, ≥2,500 Å/min; more preferably, ≥2,600 Å/min; most preferably, ≥2,700 Å/min) measured with a platen speed of 113 revolutions per minute, a carrier speed of 111 revolutions per minute, a chemical mechanical polishing composition flow rate of 150 ml/min, and, a nominal down force of 29 kPa on a 200 mm polishing machine using a chemical mechanical polishing pad comprising a polyurethane polishing layer containing polymeric hollow core microparticles and a polyurethane impregnated non-woven subpad; wherein the tungsten removal rate is an enhanced tungsten removal rate, wherein the following expression is satisfied $$W^{RR} > W^{RR}{}_0$$

wherein $W^{RR}$ is the tungsten removal rate in Å/min for the chemical mechanical polishing composition of the present invention and $W^{RR}{}_0$ is a tungsten removal rate in Å/min measured under identical conditions except that the tungsten removal rate enhancing substance according to formula I is absent from the chemical mechanical polishing composition; and, wherein the chemical mechanical polishing composition exhibits a tungsten removal rate enhancement, $\Delta W^{RR}$, of ≥10% (most preferably, wherein at least one of the following equations is satisfied:

$$((W^{RR}-W^{RR}{}_0)/W^{RR}{}_0)*100 \geq 10;$$

$$((W^{RR}-W^{RR}{}_0)/W^{RR}{}_0)*100 \geq 15;$$

$$((W^{RR}-W^{RR}{}_0)/W^{RR}{}_0)*100 \geq 20; \text{ and,}$$

$$((W^{RR}-W^{RR}{}_0)/W^{RR}{}_0)*100 \geq 25; \text{ and,}$$

wherein the chemical mechanical polishing composition exhibits a tungsten to silicon oxide removal rate selectivity of ≥5:1 (preferably, ≥6:1; more preferably, ≥50:1; most preferably, ≥75:1) measured with a platen speed of 113 revolutions per minute, a carrier speed of 111 revolutions per minute, a chemical mechanical polishing composition flow rate of 150 ml/min, and, a nominal down force of 29 kPa on a 200 mm polishing machine using a chemical mechanical polishing pad comprising a polyurethane polishing layer containing polymeric hollow core microparticles and a polyurethane impregnated non-woven subpad.

Some embodiments of the present invention will now be described in detail in the following Examples.

Comparative Examples C1-C7 and Examples 1-6

Chemical Mechanical Polishing Compositions

The chemical mechanical polishing compositions of Comparative Examples C1-C7 and Examples 1-6 were prepared by combining the components in the amounts listed in TABLE 1 (in wt %) with the balance being deionized water and adjusting the pH of the compositions as necessary to the final pH listed in TABLE 1 with nitric acid or potassium hydroxide.

Comparative Examples PC1-PC7 and Example P1-P6

Chemical Mechanical Polishing Removal Rate Experiments

Removal rate polishing tests were performed to determine the silicon dioxide removal rate (in Å/min) and the tungsten removal rate (in Å/min) using each of the chemical mechanical polishing compositions (CMPCs) prepared according to Comparative Examples C1-C7 and Examples 1-6 in Comparative Examples PC1-PC7 and Examples P1-P6, respectively. The polishing removal rate experiments were performed on 200 mm blanket 1 k tetraethylorthosilicate (TEOS) sheet wafers from SEMATECH SVTC and tungsten (W) blanket wafers available from SEMATECH SVTC. An Applied Materials 200 mm Mirra® polisher was used for all of the polishing tests. All of the polishing experiments were performed using an IC1010™ polyurethane polishing pad (commercially available from Rohm and Haas Electronic Materials CMP Inc.) using the polish conditions reported in TABLE 2. An AM02BSL8031C1-PM diamond pad conditioner (commercially available from Saesol Diamond Ind. Co., Ltd.) was used to condition the polishing pads. The polishing pads were broken in with the conditioner using a down force of 7.0 lbs (3.18 kg) for 20 minutes. The polishing pads were further conditioned ex situ prior to polishing using a down force of 5.2 lbs (2.36 kg). The TEOS removal rates reported in TABLE 3 were determined by measuring the film thickness before and after polishing using a KLA-Tencor FX200 metrology tool. The W removal rates reported in TABLE 3 were determined using a Jordan Valley JVX-5200T metrology tool.

TABLE 1

| Ex # | Colloidal silica abrasive* (wt %) | Fumed silica abrasive£ (wt %) | KIO$_3$ (wt %) | Ammonium hydrogen phthalate (wt %) | BTMAC✵ (wt %) | TBAH (wt %) | Ammonia (wt %) | Diquat (wt %)ᵉ | pH |
|---|---|---|---|---|---|---|---|---|---|
| C1 | 1 | — | 0.6 | 0.25 | — | — | — | — | 2.2 |
| C2 | 1 | — | 0.6 | 0.25 | — | — | — | 0.05 | 2.2 |
| C3 | 2 | — | 0.6 | 0.25 | — | — | — | — | 2.2 |
| C4 | 2 | — | 0.6 | 0.25 | — | — | 0.1 | — | 2.2 |
| C5 | 2 | — | 0.6 | 0.25 | — | — | — | — | 2.2 |
| C6 | 2 | — | 0.6 | 0.25 | — | 0.738 | — | — | 2.2 |
| C7 | — | 2 | 0.6 | 0.25 | — | — | — | — | 2.2 |
| 1 | 2 | — | 0.6 | 0.25 | 0.530 | — | — | — | 2.2 |
| 2 | 2 | — | 0.6 | 0.25 | 0.265 | — | — | — | 2.2 |
| 3 | 2 | — | 0.6 | 0.25 | 0.530 | — | — | — | 2.2 |
| 4 | 2 | — | 0.6 | 0.25 | 0.795 | — | — | — | 2.2 |
| 5 | — | 2 | 0.6 | 0.25 | 0.020 | — | — | — | 2.2 |
| 6 | — | 2 | 0.6 | 0.25 | 0.100 | — | — | — | 2.2 |

*Fuso PL-3 colloidal silica abrasive available from Fuso Chemical Co., Ltd.
£AERODISP ® W 7512 S dispersion of hydrophilic fumed silica available from Evonik Industries.
✵tungsten removal rate enhancing substance according to formula I, particularly, benzyltrimethyl ammonium chloride (BTMAC) available from Aldrich.
ᵉN,N,N,N',N',N'-hexabutyl-1,4-butanediammonium dihydroxide available from Sachem, Inc. having the structure below:

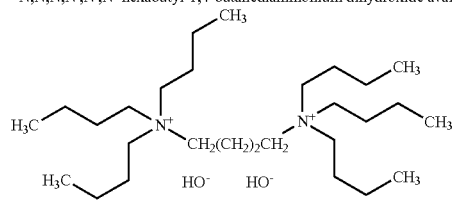

TABLE 2

| Ex # | CMPC | CMPC flow rate (ml/min) | Down force (kPA) | Platen speed (RPM) | Carrier speed (RPM) |
|---|---|---|---|---|---|
| PC1 | C1 | 150 | 20.7 | 133 | 111 |
| PC2 | C2 | 150 | 20.7 | 133 | 111 |
| PC3 | C3 | 150 | 29.0 | 113 | 111 |
| PC4 | C4 | 150 | 29.0 | 113 | 111 |
| PC5 | C5 | 150 | 29.0 | 113 | 111 |
| PC6 | C6 | 150 | 29.0 | 113 | 111 |
| PC7 | C7 | 150 | 29.0 | 113 | 111 |
| P1 | 1 | 150 | 29.0 | 113 | 111 |
| P2 | 2 | 150 | 29.0 | 113 | 111 |
| P3 | 3 | 150 | 29.0 | 113 | 111 |
| P4 | 4 | 150 | 29.0 | 113 | 111 |
| P5 | 5 | 150 | 29.0 | 113 | 111 |
| P6 | 6 | 150 | 29.0 | 113 | 111 |

TABLE 3

| (CMPC) | Tungsten removal rate (in Å/min) | TEOS removal rate (in Å/min) |
|---|---|---|
| C1 | 2580 | 383 |
| C2 | 2233 | 296 |
| C3 | 1917 | 763 |
| C4 | 1727 | 745 |
| C5 | 2037 | 616 |
| C6 | 2043 | 371 |
| C7 | 1509 | 37 |
| 1 | 2783 | 466 |
| 2 | 2634 | 506 |
| 3 | 2789 | 500 |
| 4 | 2606 | 524 |
| 5 | 2055 | 36 |
| 6 | 2597 | 32 |

We claim:

1. A method of chemical mechanical polishing a substrate, comprising:
   providing a polishing machine;
   providing a substrate, wherein the substrate comprises tungsten;
   providing a chemical mechanical polishing composition, wherein the chemical mechanical polishing composition, comprises:
   a metal oxide abrasive;
   an oxidizer, wherein the oxidizer is selected from the group consisting of $KIO_3$ and $KIO_4^-$;
   a tungsten removal rate enhancing substance according to formula I

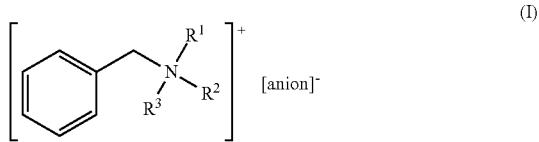

wherein $R^1$, $R^2$ and $R^3$ are each independently selected from a $C_{1-4}$ alky group; optionally, a pH adjusting agent; and,
   water;
   wherein the chemical mechanical polishing composition has a pH of 1 to 5; wherein the chemical mechanical polishing composition exhibits a tungsten removal rate, $W^{RR}$, of ≥2,000 Å/min; and, wherein the tungsten removal rate enhancing substance according to formula I imparts the chemical mechanical polishing composition with an enhanced tungsten removal rate, wherein the following expression is satisfied $$W^{RR} > W^{RR}_0$$

wherein $W^{RR}$ is the tungsten removal rate in Å/min for the chemical mechanical polishing composition and $W^{RR}_0$ is a tungsten removal rate in Å/min obtained under identical conditions except that the tungsten removal rate enhancing substance according to formula I is absent from the chemical mechanical polishing composition; and, wherein the chemical mechanical polishing composition exhibits a tungsten removal rate enhancement, $\Delta W^{RR}$, of ≥10% according to the following equation $$\Delta W^{RR} = ((W^{RR} - W^{RR}_0)/W^{RR}_0) * 100\%;$$

providing a chemical mechanical polishing pad;
   installing the chemical mechanical polishing pad and the substrate in the polishing machine;
   creating dynamic contact between the chemical mechanical polishing pad and the substrate;
   dispensing the chemical mechanical polishing composition in proximity to an interface between the chemical mechanical polishing pad and the substrate;
   wherein the chemical mechanical polishing composition comes into contact with tungsten of the substrate; and, wherein some tungsten is removed from the substrate.

2. The method of claim 1, wherein the following equation is satisfied for the chemical mechanical polishing composition provided:

$$((W^{RR} - W^{RR}_0)/W^{RR}_0) * 100 \geq 15.$$

3. The method of claim 2, wherein the following equation is satisfied for the chemical mechanical polishing composition provided:

$$((W^{RR} - W^{RR}_0)/W^{RR}_0) * 100 \geq 20.$$

4. The method of claim 2, wherein the following equation is satisfied for the chemical mechanical polishing composition provided:

$$((W^{RR} - W^{RR}_0)/W^{RR}_0) * 100 \geq 25.$$

5. The method of claim 1, wherein the chemical mechanical polishing composition provided exhibits a tungsten removal rate, $W^{RR}$, of ≥2,500 Å/min.

6. The method of claim 5, wherein the following equation is satisfied for the chemical mechanical polishing composition provided:

$$((W^{RR} - W^{RR}_0)/W^{RR}_0) * 100 \geq 15.$$

7. The method of claim 1, wherein the substrate provided further comprises silicon oxide.

8. The method of claim 7, wherein the chemical mechanical polishing composition provided exhibits a tungsten to silicon oxide removal rate selectivity of ≥5:1.

9. A method of chemical mechanical polishing a substrate, comprising:
   providing a polishing machine;
   providing a substrate, wherein the substrate comprises tungsten;
   providing a chemical mechanical polishing composition, wherein the chemical mechanical polishing composition, consists of:
   0.1 to 5 wt % of a silica abrasive;
   0.1 to 0.5 wt % of a $KIO_3$ oxidizer;

0.01 to <1 wt % of a tungsten removal rate enhancing substance according to formula I

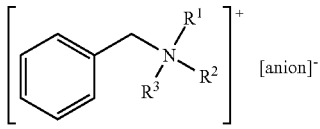 (I)

wherein $R^1$, $R^2$ and $R^3$ are each independently selected from a $C_{1-4}$ alky group; optionally, a pH adjusting agent; and,
water;
wherein the chemical mechanical polishing composition has a pH of 1 to 5; wherein the chemical mechanical polishing composition exhibits a tungsten removal rate, $W^{RR}$, of $\geq 2,000$ Å/min; and, wherein the tungsten removal rate enhancing substance according to formula I imparts the chemical mechanical polishing composition with an enhanced tungsten removal rate, wherein the following expression is satisfied $$W^{RR} > W^{RR}_0$$

wherein $W^{RR}$ is the tungsten removal rate in Å/min for the chemical mechanical polishing composition and $W^{RR}_0$ is a tungsten removal rate in Å/min obtained under identical conditions except that the tungsten removal rate enhancing substance according to formula I is absent from the chemical mechanical polishing composition; and, wherein the chemical mechanical polishing composition exhibits a tungsten removal rate enhancement, $\Delta W^{RR}$, of $\geq 10\%$ according to the following equation $$\Delta W^{RR} = ((W^{RR} - W^{RR}_0)/W^{RR}_0) * 100\%;$$

providing a chemical mechanical polishing pad;
installing the chemical mechanical polishing pad and the substrate in the polishing machine;
creating dynamic contact between the chemical mechanical polishing pad and the substrate;
dispensing the chemical mechanical polishing composition in proximity to an interface between the chemical mechanical polishing pad and the substrate;
wherein the chemical mechanical polishing composition comes into contact with tungsten of the substrate; and,
wherein some tungsten is removed from the substrate.

10. The method of claim 9, wherein $R^1$, $R^2$ and $R^3$ are each independently selected from a $C_{1-2}$ alky group.

11. The method of claim 10, wherein the chemical mechanical polishing composition, consists of:
0.1 to 5 wt % of the silica abrasive;
0.1 to 0.5 wt % of the $KIO_3$ oxidizer;
0.01 to 0.8 wt % of a tungsten removal rate enhancing substance according to formula I;
optionally, a pH adjusting agent; and,
water.

12. The method of claim 9, wherein the substance according to formula I is benzyltrimethylammonium hydroxide.

13. The method of claim 12, wherein the chemical mechanical polishing composition, consists of:
0.1 to 5 wt % of the silica abrasive;
0.1 to 0.5 wt % of the $KIO_3$ oxidizer;
0.01 to 0.8 wt % of a tungsten removal rate enhancing substance according to formula I;
optionally, a pH adjusting agent; and,
water.

14. The method of claim 13, wherein the following equation is satisfied for the chemical mechanical polishing composition provided:

$$((W^{RR} - W^{RR}_0)/W^{RR}_0) * 100 \geq 20.$$

15. The method of claim 13, wherein the following equation is satisfied for the chemical mechanical polishing composition provided:

$$((W^{RR} - W^{RR}_0)/W^{RR}_0) * 100 \geq 25.$$

* * * * *